United States Patent [19]
Vakil

[11] Patent Number: 5,902,638
[45] Date of Patent: May 11, 1999

[54] METHOD FOR PRODUCING SPALLATION-RESISTANT PROTECTIVE LAYER ON HIGH PERFORMANCE ALLOYS

[75] Inventor: Himanshu Bachubhai Vakil, Schenectady, N.Y.

[73] Assignee: General Electric Company, Schenectady, N.Y.

[21] Appl. No.: 08/024,034

[22] Filed: Mar. 1, 1993

[51] Int. Cl.⁶ ..................................................... C23C 16/00
[52] U.S. Cl. ................... 427/248.1; 427/250; 427/255.7; 427/419.1; 427/419.2; 427/372.2
[58] Field of Search ................................. 427/248.1, 250, 427/255.7, 419.2, 419.1, 314, 372.2; 428/633

[56] References Cited

U.S. PATENT DOCUMENTS 3,677,789   7/1972   Bungardt et al. .
4,132,816   1/1979   Benden et al. .

*Primary Examiner*—Roy V. King
*Attorney, Agent, or Firm*—Noreen C. Johnson; Douglas E. Stoner

[57] ABSTRACT

A method for producing on the surface of a nickel- or cobalt-based superalloy article a spallation-resistant aluminum oxide layer. An aluminum oxide layer is produced, typically under tensile stress, by chemical vapor deposition at low temperatures on a metal aluminide layer that has been deposited on the surface of the article whereby nickel or cobalt from the superalloy surface reacts with an aluminum compound to form the metal aluminide layer. The aluminum oxide layer under tensile stress is then heated to induce cracking therein, which imparts spallation resistance thereto. If desired, a thermal barrier layer may be deposited on the aluminum oxide layer.

11 Claims, No Drawings

METHOD FOR PRODUCING SPALLATION-RESISTANT PROTECTIVE LAYER ON HIGH PERFORMANCE ALLOYS

FIELD OF THE INVENTION

The present invention relates to producing adherent and oxidation resistant coatings on superalloys and more particularly to aluminide coatings having a spallation-resistant alumina layer therein.

BACKGROUND OF THE INVENTION

High performance superalloys, such as nickel- or cobalt-based superalloys, are being increasingly employed in various types of gas turbine engines used, for example, in the propulsion and power generation industries. High pressure components (e.g., airfoils) of high performance and high fuel efficiency turbine engines generally have a hollow core made of nickel- or cobalt-based superalloy and these components are subjected to corrosive exhaust gases at extremely high temperatures of up to 1150° C. during the operation of a gas turbine engine. As a result, these components are prone to oxidation damage. Various solutions have been tried to prevent such oxidation damage.

One means typically employed is to provide the components with an environmentally resistant coating typically provided by an aluminum-rich alloy, such as aluminide, whose surface oxidizes to form an aluminum oxide (alumina) scale at elevated temperatures. Such a scale provides a tough, adherent layer that is highly resistant to oxidation and corrosion attack. However, one of the major problems faced by these environmentally resistant coatings is the spallation of the alumina layer thus formed. Upon subsequent cooling of the turbine blade, the thermal mismatch in the coefficients of thermal expansion of the underlying superalloy substrate and the alumina layer disposed thereon leads to an enormous compressive stress on the alumina layer. Thus, when the alumina layer is repeatedly subjected to such intense thermal cycles, spallation of the alumina layer frequently occurs. This in turn triggers regeneration of alumina when the underlying exposed aluminide layer is oxidized by the air at high temperatures produced during the normal working cycle of a gas turbine engine. This regeneration process depletes available aluminum from the underlying aluminide layer disposed on the surface of the substrate, ultimately limiting the life of the coated component. Furthermore, when a thermal barrier coating is applied on the alumina layer, any spallation of the underlying alumina layer results in loss of the overlying thermal barrier coating with grave consequences. Therefore, creating a spallation-resistant alumina layer is critical.

One example of such a spallation-resistant alumina interfacial layer is disclosed in the U.S. Pat. No. 4,880,614 where a high purity alumina interfacial layer is provided between the metallic substrate and the ceramic thermal barrier coating.

STATEMENT OF THE INVENTION

The present invention is directed to a method of producing a spallation-resistant protective layer on the surface of a nickel- or cobalt-based superalloy substrate, said method comprising the steps of:

depositing an adherent metal aluminide layer on said substrate, the metal aluminide in said layer being nickel or cobalt aluminide;

depositing an aluminum oxide layer on the surface of said metal aluminide layer; and heating said aluminum oxide layer.

The present invention is also directed to an article having an spallation-resistant protective layer thereon, said article comprising a nickel- or cobalt-based superalloy substrate; an adherent metal aluminide layer disposed on the surface of said substrate, the metal aluminide in the adherent layer being nickel or cobalt aluminide; and an aluminum oxide layer having cracks therein disposed on the surface of said metal aluminide layer.

DETAILED DESCRIPTION

High performance superalloys are well known in the art. Nickel- or cobalt-based superalloy substrates are particularly suitable for depositing an aluminide layer by the method of the present invention. One example of nickel-based superalloy (all alloy percentages being by weight) comprises 53% nickel, 19% iron, 18% chromium, 5% niobium, 3% molybdenum, 1% titanium, 0.5% aluminum, 0.05% carbon and 0.005% boron. Another example of nickel-based superalloy, known as MAR-M247, comprises 10% cobalt, 10% tungsten, 3.3% tantalum, 8.4% chromium, 0.65% molybdenum, 1.05% titanium, 5.5% aluminum, and 1.4% hafnium alloyed with minor amounts of carbon and boron in a nickel matrix. One example of a cobalt-based superalloy comprises 57.5% cobalt, 10% nickel 25% chromium and 7.5% tungsten. Still other types of superalloys are discussed in more details in U.S. Pat. Nos. 4,209,348, 4,582,548, 4,643,782 and 4,719,080, all of which are incorporated herein by reference. It should be noted that sometimes trace amounts of elements such as yttrium and zirconium are present in these superalloys. Nickel-based superalloy is preferred.

Before commencing the deposition of an adherent metal aluminide layer on the surface of a superalloy substrate, by the process disclosed below, the surface of the substrate is preferably degreased, grit blasted and then cleaned.

The metal aluminide layer, also known as a diffusion coating, is generally produced on the superalloy surface by conventional means whereby aluminum is reacted at the substrate surface to form an aluminum intermetallic compound. Thus, the metal aluminide layer is predominantly composed of an aluminum intermetallic compound, such as nickel or cobalt aluminide, formed by reacting aluminum vapor, aluminum-rich alloy powder or aluminum-rich compound with the substrate elements, such as nickel or cobalt, in the surface layer of the underlying superalloy substrate. This layer is typically well bonded to the substrate surface.

Aluminiding may be accomplished by conventional techniques, such as chemical vapor deposition (hereinafter sometimes "CVD"), pack aluminiding, spraying, electrophoresis, sputtering or slurry sintering with an aluminum-rich vapor and appropriate diffusion heat treatments. Some of these methods are disclosed by Meier, G. H. and Pettit, F. S. in *High-Temperature Corrosion of Alumina-Forming Coatings for Superalloys,* Surface and Coatings Technology, 39/40 (1989), pp. 1–17, incorporated herein by reference. The metal aluminide layer may be deposited from room temperature up to about 1200° C., depending upon the particular aluminiding process employed, and it usually has a thickness of about 0.025–0.125 mm., preferably about 0.07–0.08 mm.

The metal aluminide layer is preferably deposited on the surface of the substrate of an article, such as a high pressure component of a gas turbine engine, by conveying a mixture of hydrogen and aluminum halide compound into a CVD chamber having the substrate heated to a temperature of about 900–1200° C. and maintained at a pressure of about 150–760 torr, and chemically vapor depositing a reaction product of the mixture on the surface of the substrate to form the metal aluminide layer.

Reference is also made to copending, commonly owned U.S. patent application Ser. No. 08/024,043 for a preferred method of producing the aforementioned adherent metal aluminide layer. Said application discloses a method of forming a hypo-stoichiometric aluminide region on the surface of a superalloy substrate, followed by forming a hyper-stoichiometric aluminide layer on the hypo-stoichiometric aluminide region.

Other elements can be incorporated in the aluminide layer by a variety of processes. Beneficial elements include platinum, silicon, hafnium and oxide particles such as alumina, yttria or hafnia for enhancement of aluminum oxide scale adhesion; chromium and manganese for hot corrosion resistance; rhodium and tantalum for diffusional stability and/or oxidation resistance; and nickel or cobalt for increasing ductility and/or incipient melting limits. These elements, preferably platinum, can be added to the surface of the component prior to aluminiding by a wide range of processes including electroplating, pack cementation, CVD, powder metal layer deposition, thermal spray or physical vapor deposition processes.

Some methods of coating, such as slurry fusion, permit some or all of the beneficial coating elements, including aluminum, to be added concurrently. Other processes, such as CVD and pack cementation, can be modified to concurrently apply elements such as silicon, platinum or chromium with aluminum. Platinum modified aluminide diffusion coatings are disclosed in Platinum Modified Aluminides Present Status, by Smith, J. S., and Boone, D. H., The American Society of Mechanical Engineers, 90-GT-319, June 11–14, 1990.

After completing the deposition of the aluminide layer on the superalloy substrate, deposition of a spallation-resistant aluminum oxide ($Al_2O_3$) layer on the metal aluminide layer can be commenced. An aluminum oxide layer is deposited, typically under tensile stress, on the metal aluminide layer by conveying an organoaluminum composition, such as aluminum diacetoacetic ester chelate, a mixture of aluminum isopropoxide and oxygen, a mixture of aluminum isopropoxide and nitrogen, aluminum triethoxide, aluminum acetylacetonate, a mixture of tri-isobutylaluminum and oxygen or a mixture of trimethylaluminum and nitrous oxide, into the CVD chamber having the substrate positioned therein.

The substrate is cooled from the first CVD temperature to a second CVD temperature of about 250–500° C. prior to conveying the metal-organic composition into the chamber. The precise second CVD temperature depends upon which of the aforementioned compositions is employed. Some suitable temperatures are disclosed in *Thin Film* Processes by Vossen and Kern, Academic Press, pp. 291–292, incorporated herein by reference. A reaction product of the composition is thus deposited on the metal aluminide layer to form the aluminum oxide layer under tensile stress. The conditions within the CVD chamber, such as the second CVD temperature and the chamber pressure, should be so adjusted that the formation of the aluminum oxide layer under tensile stress is enhanced and it is preferably produced at a rate of about 1 Å per second. Such a layer generally has an amorphous structure and has a thickness of about 0.1–5.0 microns, preferably about 1–2 microns.

The preferred composition is aluminum diacetoacetic ester chelate. It is pyrolyzed at the second CVD temperature in the range of about 300–500° C., preferably about 400–450° C., and at a pressure in the range of about 1–30 torr, preferably at about 10 torr. Preferably, the same CVD chamber as the one used for depositing the metal aluminide layer is utilized in this step, with care being taken to preserve a clean interface.

After the deposition of the aluminum oxide layer, the temperature in the CVD chamber is gradually increased from the second CVD temperature to a heat treatment temperature of about 900–1200° C., preferably about 1000–1100° C. This converts the mostly amorphous aluminum oxide layer under tensile stress into a spallation-resistant aluminum oxide layer, which is a stable form of alumina. During the aforementioned conversion of the mostly amorphous aluminum oxide layer into the spallation-resistant aluminum oxide layer, tensile cracking of the layer occurs. Such cracking is beneficial because as a superalloy substrate is heated or cooled, it expands (or contracts) at a greater rate than the aluminum oxide layer deposited thereon. It is believed, without reliance thereon, that the cracks in the aluminum oxide layer permit the aluminum oxide layer to expand and contract without producing stresses that would induce spalling of the aluminum oxide layer.

As stated before, the temperature in the CVD chamber is gradually increased, i.e., ramped, at a rate of about 0.5° C. to about 3° C. per minute, preferably at about 1° C. to about 2° C. per minute, in about ¾ to about 4 hours, preferably in about 1 to about 2 hours. Once the heat treatment temperature is attained, the substrate is maintained at that temperature for about 1 to about 3 hours, preferably for about 2 hours to induce tensile cracking therein. The aforementioned heat treatment may be carried out under an inert environment, typically one provided by a noble gas, such as argon or helium; under a reducing environment, typically one provided by a mixture of about 25% by volume of hydrogen mixed with an inert gas; or under an oxidizing environment, typically one provided by a mixture containing about 50% by volume of oxygen in an inert gas, such as helium. The oxidizing environment is preferred since it helps in oxidizing any residual carbon deposits that were produced during the aforementioned chemical vapor depositing of the aluminum oxide layer under tensile stress. The oxidizing environment also allows oxidation of portions of the metal aluminide layer exposed through the cracks in the aluminum oxide layer to form alumina therein. Such a formation of alumina within the cracks in the aluminum oxide layer further improves the oxidation resistance of the spallation-resistant protective layer of the present invention.

If desired, a thermal barrier layer may be deposited on the spallation-resistant protective layer. The thermal barrier layer, which may be applied as the final coating is preferably a columnar grained ceramic layer, such as a zirconia layer, deposited on the aluminum oxide layer having cracks therein. The columnar grains are preferably oriented substantially perpendicular to the surface of the substrate with interstices, or at least porosity, between the individual columns extending from the surface of the thermal barrier layer down to or near (within a few microns) the aluminum oxide layer. The thickness of the barrier layer is typically in the range of about 0.075–1.5 mm. Such a thermal barrier layer is highly effective in reducing the amount of heat transferred to the substrate, thereby reducing the temperature of the metal.

The thermal barrier layer may be produced by any suitable conventional process, such as air plasma spray, electron beam physical vapor deposition or low pressure plasma spray. Low pressure spray is preferred. Any suitable ceramic thermal barrier layer may be used. A preferred ceramic layer composition being zirconia stabilized with yttria comprising about 6% to about 30% by weight of yttrium oxide, most preferably about 8% to about 20%. Other stabilizers suitable with zirconia are CaO, MgO, $CeO_2$ as well as $Y_2O_3$. These zirconia ceramic layers have a thermal conductivity that is about a factor of thirty lower than that of the typical nickel-based superalloy substrate. Other ceramics which are believed to be useful as thermal barrier layer include alumina, ceria, hafnia (yttria-stabilized), mullite and zirconium silicate.

The present invention is also directed to an article comprising a nickel- or cobalt-based superalloy substrate, preferably nickel-based, having a spallation-resistant adherent nickel or cobalt aluminide protective layer disposed on the surface thereof, and an aluminum oxide layer having cracks disposed on the metal aluminide layer.

The article may be further provided with a thermal barrier layer having a composition of about 6–30% by weight of yttrium oxide, the balance being zirconia.

What is claimed is:

1. A method of producing a spallation-resistant protective layer on the surface of a nickel or cobalt-based superalloy substrate, said method comprising the steps of: depositing an adherent metal aluminide layer on said substrate, the metal aluminide in said layer being nickel or cobalt aluminide;

depositing an aluminum oxide layer on the surface of said metal aluminide layer wherein aluminum diacetoacetic ester chelate is conveyed into a chemical vapor deposition chamber and pyrolyzed at a temperature of about 300–500° C. and at a pressure of about 1–30 torr to chemically vapor deposit a reaction product of aluminum diacetoacetic ester chelate on said metal aluminide layer to form said aluminum oxide layer under tensile stress; and heating said aluminum oxide layer.

2. The method of claim 1 further comprising depositing a thermal barrier layer on said spallation-resistant protective layer.

3. The method of claim 2 wherein said thermal barrier layer comprising a composition of about 6–30% by weight of yttrium oxide, the balance being zirconia.

4. The method of claim 1 wherein said step of depositing said metal aluminide layer comprises:

conveying a mixture of hydrogen and aluminum halide into a chemical vapor deposition chamber having said substrate heated to a first chemical vapor deposition temperature; and depositing a reaction product of said mixture on said substrate.

5. The method of claim 4 wherein said mixture further comprises a compound of at least one of platinum, yttrium and hafnium.

6. The method of claim 1 wherein said heating of said aluminum oxide layer is carried out at about 900–1200° C. for about 1–2 hours.

7. The method of claim 6 wherein said heating is carried out in an oxidizing environment.

8. The method of claim 6 wherein said heating is carried out in an inert environment.

9. The method of claim 6 wherein said heating is carried out in a reducing environment.

10. A method of producing a spallation-resistant protective layer comprising the steps of:

depositing, by chemical vapor deposition, an adherent nickel or cobalt aluminide layer on the surface of a nickel- or cobalt-based superalloy substrate positioned inside a chemical vapor deposition chamber and heated to a first chemical vapor deposition temperature;

cooling said substrate from said first chemical vapor deposition temperature to a second chemical vapor deposition temperature in the range of about 300–500° C.;

conveying an organoaluminum composition into said chemical vapor deposition chamber;

chemically vapor depositing a reaction product of said organoaluminum composition on said metal aluminide layer to form an aluminum oxide layer; and heating said aluminum oxide layer to a heat treatment temperature.

11. The method of claim 10 wherein said heat treatment temperature is in the range of about 900–1200° C.

* * * * *